（12）United States Patent
Giaretta et al.

(10) Patent No.: US 7,372,879 B2
(45) Date of Patent: May 13, 2008

(54) WAVELENGTH LOCKER USING MODULATOR CURRENT AND PHOTODETECTOR

(75) Inventors: Giorgio Giaretta, Mountain View, CA (US); Yuxin Zhou, Fremont, CA (US)

(73) Assignee: Finisar Corporation, Sunnyvale, CA (US)

( * ) Notice: Subject to any disclaimer, the term of this patent is extended or adjusted under 35 U.S.C. 154(b) by 459 days.

(21) Appl. No.: 11/006,032

(22) Filed: Dec. 6, 2004

(65) Prior Publication Data

US 2005/0125177 A1    Jun. 9, 2005

Related U.S. Application Data

(60) Provisional application No. 60/527,220, filed on Dec. 5, 2003.

(51) Int. Cl.
*H01S 3/10* (2006.01)
*H01S 3/13* (2006.01)

(52) U.S. Cl. ...................... 372/29.02; 372/26

(58) Field of Classification Search ............... 372/26, 372/28, 29.02, 29.021, 32, 38.02, 38.07
See application file for complete search history.

(56) References Cited

U.S. PATENT DOCUMENTS 5,033,114 A     7/1991  Jayaraman et al. ......... 455/618
5,319,435 A     6/1994  Melle et al. ................. 356/32
5,469,265 A     11/1995 Measures et al. ........... 356/419
6,243,401 B1    6/2001  Lee ............................ 372/20
7,120,183 B2 *  10/2006 Krasulick et al. .......... 372/50.1

OTHER PUBLICATIONS

Kikuchi, et al., "Performance Analysis of Separated-Electrode DFB Laser Diode," Electronics Letters, vol. 25, Issue No. 2, Jan. 19, 1989, pp. 162-163.

* cited by examiner

Primary Examiner—Armando Rodriguez
(74) Attorney, Agent, or Firm—Workman Nydegger

(57) ABSTRACT

The wavelength of light emitted by a laser and modulated by a frequency response modulator is determined from the power of the emitted light and the current drawn by the modulator. From the temperature and current applied to the modulator and the optical power of the emitted light; the wavelength of the beam of light is determined as a function of a ratio of the current and power for each temperature of operation. As the wavelength of the emitted light shifts, for example as the laser ages or the laser temperature shifts, the inventive methods and devices then detect the wavelength shift and implement any necessary adjustments in the operating conditions of the laser diode. For example, a thermoelectric cooler can be used to heat or cool the laser diode as necessary to thereby adjust the wavelength of the emitted light.

18 Claims, 5 Drawing Sheets

WAVELENGTH LOCKER USING MODULATOR CURRENT AND PHOTODETECTOR

CROSS-REFERENCE TO RELATED APPLICATIONS

This application claims the benefit of U.S. Provisional Patent Application No. 60/527,220, filed Dec. 5, 2003, which is hereby incorporated by reference.

BACKGROUND OF THE INVENTION

1. The Field of the Invention

The present invention generally relates to high speed data transmission systems. More particularly, the present invention relates to methods for identifying the frequency of light emitted by a laser and adjusting the laser operating conditions as necessary to maintain the laser emitting light at a desired frequency.

2. The Relevant Technology

The use of fiber optic technology is an increasingly important method of data transmission. Through fiber optics, digital data in the form of light signals is formed by light emitting diodes or lasers and then propagated through a fiber optic cable. Such light signals allow for high data transmission rates and high bandwidth capabilities. Other advantages of using light signals for data transmission include their resistance to electro-magnetic radiation that interferes with electrical signals; fiber optic cables' ability to prevent light signals from escaping, as can occur with electrical signals in wire-based systems; and light signals' ability to be transmitted over great distances without the signal loss typically associated with electrical signals on copper wire. In practice, however, it is often necessary to convert an electrical signal to a light signal and vice versa.

Transceiver modules are widely used in the field of optoelectronics for this purpose. Typically, a transceiver module includes a transmitter optical subassembly (TOSA), a receiver optical subassembly (ROSA), and a printed circuit board (PCB) for coordinating the operation of each of the TOSA and the ROSA. Each of the TOSA and the ROSA may have an optical receptacle, for example an LC cable receptacle or an SC cable receptacle, at one end for attachment to an optical cable and some device at the other end to enable a conductive connection to a printed circuit board. The entire transceiver module, in turn, is connected to a computer system, such as a host system, for controlling the operation of the transceiver module. Thus, the computer system can direct the transceiver module to transmit an optical signal by directing an electronic signal through the printed circuit board and into the TOSA.

The TOSA in turn generates a modulated digital optical signal via an internal laser or light emitting diode (LED). The modulated digital optical signal typically includes pulsed light. The production of a pulse of light by the laser or LED can correspond to a digital "one" or "zero," while no pulse corresponds to a "zero" or "one," respectively, according to the configuration of the network. The modulated optical data signal produced by the laser can then be transmitted in a fiber optic cable via the optical network.

Similarly, the ROSA receives a modulated digital optical signal from the incoming optical cable at a photodiode, converts the optical signal into an electrical signal, and transmits the electrical signal to a PCB within the ROSA. From the PCB the electrical signal is relayed to a computer system.

The PCB includes, for example, a controller, which governs general operation of the transceiver, a laser driver for controlling operation of the laser in the transmitter portion of the transceiver, and a post-amplifier for controlling the conversion of incoming optical signals into electrical signals in the receiver portion. These components are typically configured as integrated circuits on the PCB.

One challenge in optimizing optical data transmission technology is the need to have precise control over the transmission or carrier wavelengths. Such control over the carrier wavelengths is necessary in order to provide stable communication. Problems in wavelength division multiplexing (WDM) systems, for example, occur when one or more of various multiplexed wavelength signals in an optical fiber begin to drift and thereby interfere with one or more multiplexed wavelength signals traveling on adjacent wavelength channels. These problems can be accentuated when the channel spacing becomes closer, for example with dense wavelength division multiplexing (DWDM) systems.

Wavelength drift can occur for a variety of different reasons. For example, wavelength drift can happen when optical elements, such as a laser, within a WDM system experience a temperature variation or a laser ages. Regardless of why the wavelength of a laser is prone to change, however, it is necessary to ensure that the laser emits at a relatively constant wavelength. Devices to adjust the lasing wavelength to a desired wavelength are known in the art, but to properly adjust the lasing wavelength it is nevertheless necessary to monitor emitted light and thereby know the actual wavelength of the emitted light. Devices external to a transceiver are often conventionally used to monitor the wavelength of a laser.

Certain devices and methods internal to a transceiver are also known for monitoring the wavelength of a laser. For example, U.S. Pat. No. 5,469,265 ("the '265 patent") discloses various methods for determining wavelength. Among the disclosed methods is the determination of a ratio between unfiltered and filtered light, wherein the ratio can be used directly to ascertain the laser wavelength. Another disclosed method light uses a multiple quantum well electroabsorption device. In this embodiment, the multiple quantum well electroabsorption device is switched between reference and tracking modes to determine a ratio between the two. This has the disadvantage, however, of losing independent wavelength-dependent and wavelength-independent detector readings.

Another example of a device internal to a transceiver for monitoring wavelength is U.S. Pat. No. 6,243,401 ("the '401 patent"), which discloses the use of a semiconductor laser amplifier (SLA) as a wavelength discriminator. According to the '401 patent, the wavelength can be determined by measuring the transparent current of an SLA from the induced voltage across the diode junction when incident light is intensity-modulated. Based on the value of the transparent current, the wavelength is calculated by referencing a lookup table.

What is still needed, however, are improved and simpler methods for monitoring and controlling laser wavelengths.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

BRIEF SUMMARY OF THE INVENTION

Figure 1:
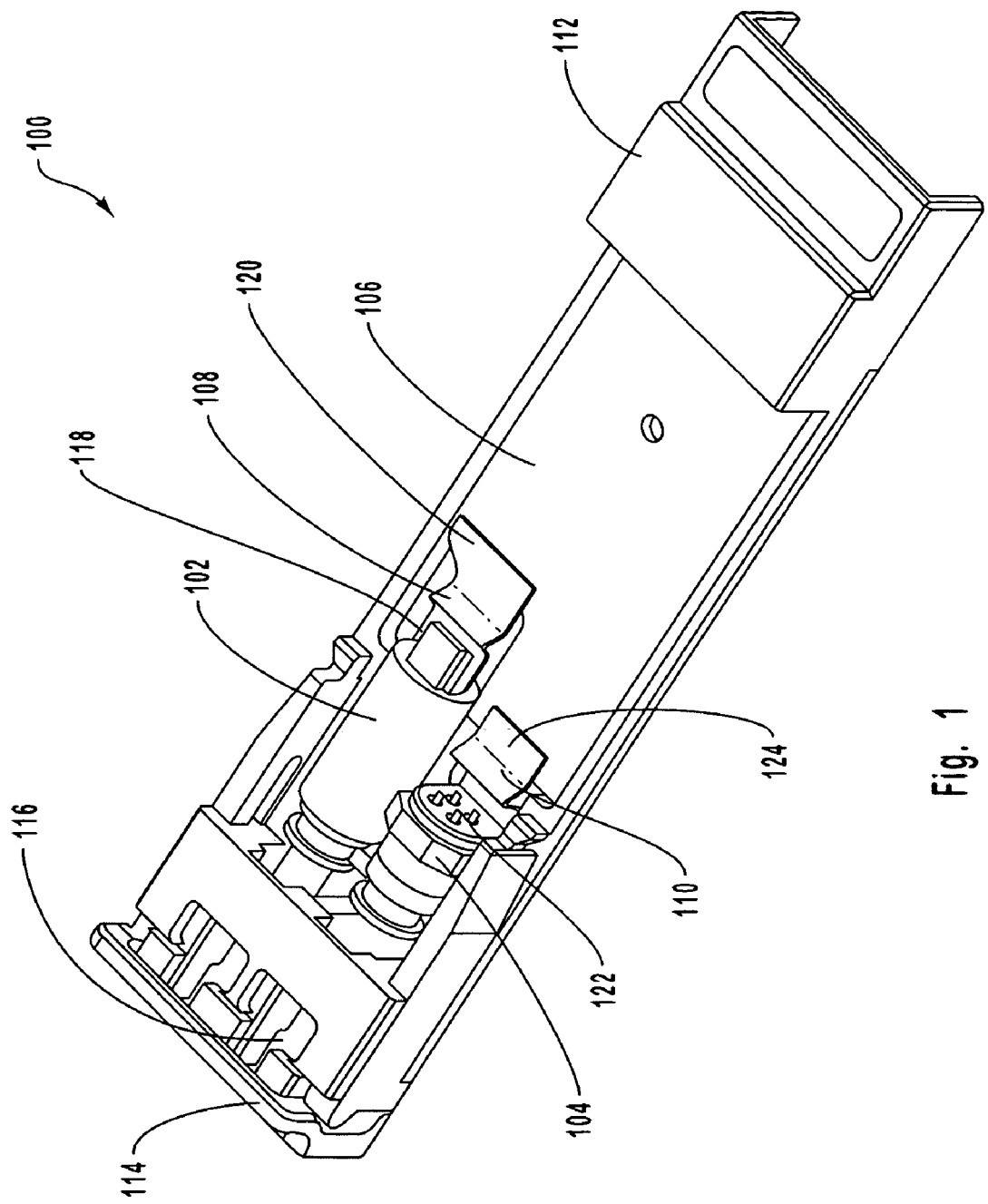
FIG. 1 is a schematic diagram that illustrates aspects of an optical transceiver according to various embodiments of the invention.

The present invention relates to methods and systems for determining the wavelength of light emitted by a laser diode so that necessary or desired wavelength adjustments can be made. More particularly, the inventive methods use the determined power of the emitted light in relation to the known current supplied to the modulator to determine the wavelength of the light emitted by the laser diode. Generally, the invention is compatible with modulators that have a frequency response such that the current consumed by the modulator varies with the wavelength of the beam of light the modulator is modulating. As a result, shifts in the current drawn by the modulator are indicative of shifts in the emitted wavelength. The overall laser power is monitored and used to compensate for other sources of changes in the current drawn by the modulator.

Accordingly, a first example embodiment of the invention is a method of determining the wavelength of light emitted by a laser diode. The method includes: determining the temperature of a laser diode or a modulator that receives a beam of light from the laser diode and modulates an optical signal onto the beam of light; determining the current applied to the modulator; determining the optical power of the beam of light emitted by the laser diode; and determining the wavelength of the beam of light from the measured temperature, the current applied to the modulator, and the optical power of the beam of light.

Another example embodiment of the invention is an optical transceiver which performs the methods disclosed herein. In one embodiment the power line from a laser driver to the modulator has a sensing resistor on it to determine the current used by the modulator. Various embodiments of the invention also use a thermistor to determine the laser and/or modulator temperature and a thermoelectric cooler to adjust the temperature of the laser as necessary to adjust the emitted wavelength back to within the desired tolerance range. In addition, a back facet monitor photodiode can be used to determine the output power of the laser.

Accordingly, another embodiment of the invention is also a method of determining the wavelength of light emitted by a laser diode. This method includes: determining the temperature of an electroabsorption modulator through a thermistor in close proximity with the electroabsorption modulator; determining the current applied to the electroabsorption modulator that receives a beam of light from the front facet of a distributed feedback laser, wherein the electroabsorption modulator and the distributed feedback laser are an integrated device; at a rear facet photodiode, determining the optical power of the beam of light received from the back facet of the distributed feedback laser; and determining the wavelength of the beam of light from the known temperature, the known current, and the ratio of the current applied to the electroabsorption modulator to the optical power of the beam of light.

Embodiments of the invention may, in addition to the foregoing methods, perform the act of: upon determining that the wavelength of light from a distributed feedback laser has shifted from an intended wavelength, modifying the cooling or heating activity of a thermoelectric cooler which is located in the vicinity of the laser diode, wherein the wavelength of the light emitted by the distributed feedback laser varies with the operating temperature of the distributed feedback laser and therefore varies with a change in temperature effectuated by the thermoelectric cooler.

Yet other embodiments of the invention are computer program products for implementing methods suitable for use in determining the wavelength of light emitted by a laser diode. The computer program products include a computer readable medium carrying computer executable instructions for performing the methods as disclosed herein. The computer program products may be integrated into a printed circuit board within an optical transceiver.

These and other objects and features of the present invention will become more fully apparent from the following description and appended claims, or may be learned by the practice of the invention as set forth hereinafter.

DETAILED DESCRIPTION OF THE PREFERRED EMBODIMENTS

In WDM systems, each laser is responsible for emitting an optical signal that is within a specific wavelength channel. In dense wavelength division multiplexing applications (DWDM) systems, the channels are very small so that even slight wavelength variations can lead a signal to drift from its intended channel. Unfortunately, this wavelength drift is common. Example causes of such wavelength drifting include a laser heating during operation within a transmitter optical subassembly (TOSA) or laser aging. If these laser parameters are actively monitored during transceiver operation, adjustment can be made to the laser device to ensure its proper operation.

The present invention relates to methods and systems for determining the wavelength of light emitted by a laser diode so that necessary adjustments can be made. More particularly, the inventive methods use the determined power of the emitted light in relation to the known current supplied to a modulator to determine the wavelength of the light emitted by the laser diode.

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

In the following description, numerous specific details are set forth in order to provide a thorough understanding of the present invention. It will be obvious, however, to one skilled in the art that the present invention may be practiced without these specific details. In other instances, well-known aspects of optical systems have not been described in particular detail in order to avoid unnecessarily obscuring the present invention.

Reference is first made to FIG. 1, which illustrates a perspective view of one presently preferred embodiment of a transceiver module, designated generally at 100. The depicted transceiver module is presented by way of example only in order to depict a suitable device environment in which the invention may be practiced. One skilled in the art will recognize that the depicted transceiver is only one of many transceiver configurations in which the invention can be practiced.

More specifically, the depicted transceiver module is an XFP transceiver module for use in telecommunications networks, local area networks, metro area networks, storage area networks, wide area networks, and the like. XFP transceivers are designed to occupy one-fifth of the space and dissipate one-half the power of prior 10 Gb/s modules. The depicted transceiver module may include a temperature-compensated electroabsorption modulated laser (EML) for use in DWDM systems and therefore be more completely described as a DWDM EML XFP transceiver module. The transceiver modules constructed according to the invention can be compatible with the XFP MSA standards, for example including those set forth in the 10 Gigabit Small Form Factor Pluggable Module adoption ratified specification Revision 3.1 published by the XFP Multi Source Agreement (MSA) Group on Apr. 2, 2003 (xfpmsa.org), which is incorporated herein by reference, and can also be compatible with future revisions or final XFP MSA specifications that will be adopted in the future.

As depicted in FIG. 1, XFP transceiver module 100 includes TOSA 102, ROSA 104, printed circuit board 106, first flexible circuit 108 and second flexible circuit 110. First flexible circuit 108 interconnects TOSA 102 and printed circuit board 106 while second flexible circuit 110 interconnects ROSA 104 and printed circuit board 106. Also depicted as part of module 100 are housing 112 for containing the electrical components of module 100 and bail release 114 and LC cable receptacles 116 for receiving and securely attaching LC cables to TOSA 102 and ROSA 104.

TOSA 102 may be an EML TOSA as described in FIG. 2 below and as more fully described in U.S. patent application Ser. No. 10/629,253, entitled "Small Form Factor Transceiver with Externally Modulated laser," filed Jul. 28, 2003, which is incorporated herein by reference. Of course, one skilled in the art will recognize that other TOSA assemblies may be compatible with embodiments of the present invention and may be included within the scope of the invention.

ROSA 104 may be, for example, an avalanche photodiode (APD) or PIN photodiode. The preferred APD is a conventional device that operates with a reverse-bias voltage that causes the primary photocurrent to undergo amplification by cumulative multiplication of charge carriers. In operation, the ROSA receives an optical signal, converts the optical signal to an electrical signal at the photodiode, and relays the electrical signal to the PCB in the transceiver.

Figure 2:
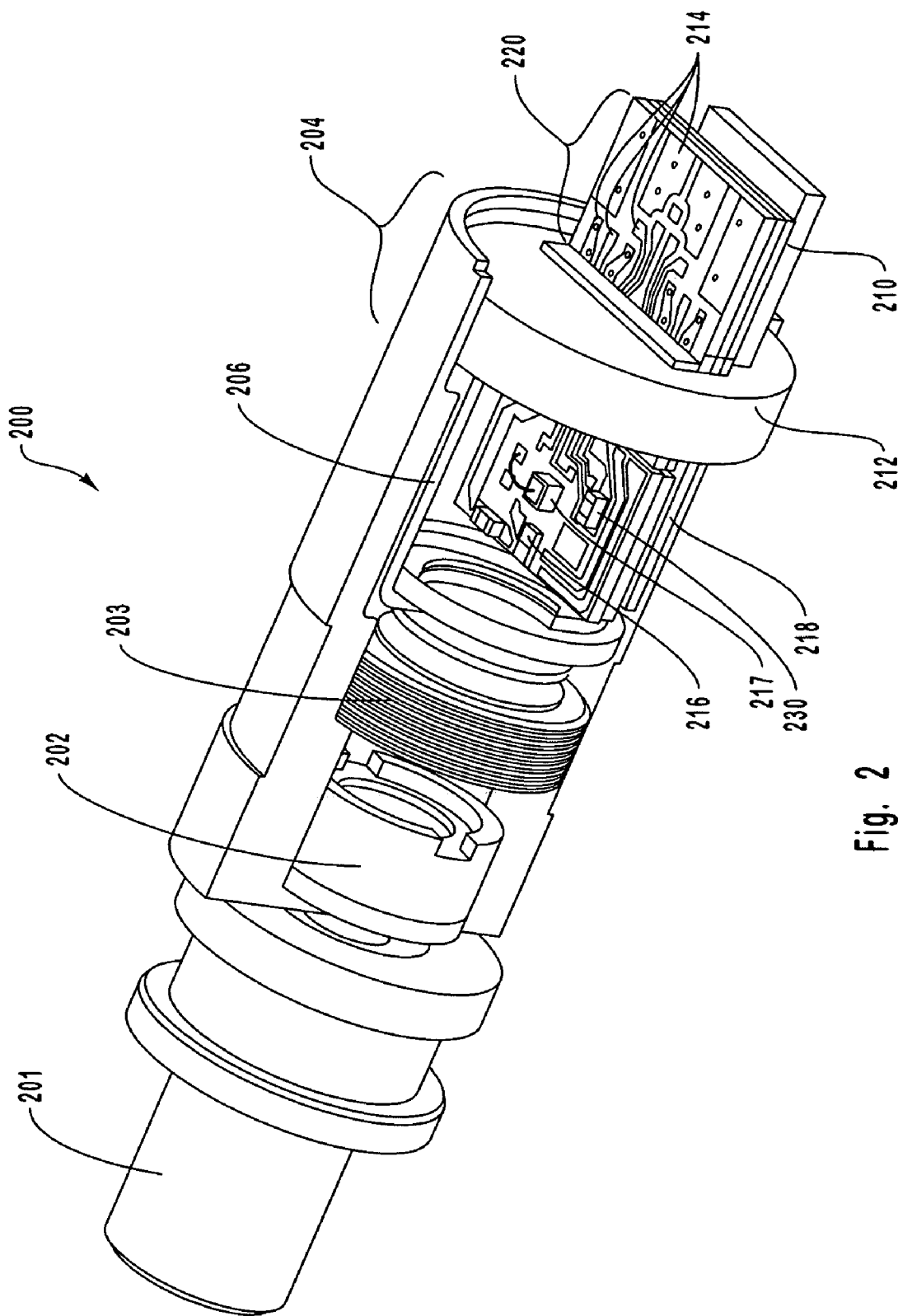
FIG. 2 is a schematic diagram that illustrates aspects of a transmitter optical subassembly according to embodiments of the invention.

Referring now to FIG. 2, one embodiment of a TOSA 200 generally includes nosepiece 201 for receiving an LC ferrule, isolator 202, lens assembly 203, and header assembly 204. Generally, transistor headers, or transistor outlines are widely used in the field of optoelectronics, and may be employed in a variety of applications. Header assembly 204 generally includes hermetically sealed window can 206, thermal slug 210, base 212, and ceramic feedthrough 220.

As depicted, header assembly 204 is a cylindrical metallic base 212 with a ceramic feedthrough 220 having a number of conductive traces 214 thereon extending completely through, and generally perpendicular to, the base. The base can be formed of, by way of example only, Alloy 42, which is an iron nickel alloy, as well as cold-rolled steel, or Vacon VCF-25, and Kovar alloys. A seal between thermal slug 210 and base 212 provides mechanical and environmental protection for the components contained in the TO-can and electrically isolates the conductive traces from the metallic material of the base. The seal may be, for example, a hermetically brazed wrap-around metallization on a ceramic header. Alternatively, the thermal slug 210 and ceramic feedthrough 220 may incorporate two additional ceramic outer layers to electrically isolate the outermost conductors. In this second case, a metal braze or solder can be used to hermetically seal thermal slug 210 and ceramic feedthrough 220 to base 212. This solution overcomes the principal shortcomings of glasses, namely their low strength, brittleness, and low thermal conductivity.

The ceramic feedthrough 220 is structured to house multiple electrical components, support thermoelectric cooler ("TEC") 218, and support conductive traces 214 through base 212. The ceramic feedthrough 220 is constructed from an insulating material such as a ceramic and has flat surfaces on either side of base 212 that are configured to receive the multiple electrical components. In the illustrated embodiment, such electrical components include, for example, an EML 216, a rear facet photodiode 217, a thermistor 230, and resistors, capacitors, and inductors that are used to balance the driving impedance of the laser with the component impedance as well as thermistors and other devices. One embodiment of EML 216 and photodiode 217 will be described in greater detail hereinbelow with respect to FIGS. 3 and 4.

TEC 218 is mounted directly to thermal slug 210. In an exemplary embodiment, TEC 218 relies for its operation and usefulness on the Peltier effect wherein electrical power supplied to the TEC 218 may, according to the requirements of a particular application, cause selected portions of the TEC 218 to generate heat and/or provide a cooling effect. Exemplary construction materials for the TEC 218 may include, but are not limited to, bismuth-telluride combinations, or other materials with suitable thermoelectric properties. Please note that the TEC 218 represents an exemplary configuration only, and various other types of cooling or heating devices may alternatively be employed as required to suit the dictates of a particular application. By way of example, where active temperature control of one or more electronic devices, aspects of which are discussed in more detail below, is not required, the TEC 218 may be replaced with a thermally conductive spacer or similar device.

The ceramic feedthrough 220 further includes multiple electrically isolated conductive traces 214, or feedthroughs, extending throughout ceramic feedthrough 220 and consequently through base 212. The conductive traces 214 provide the electrical connections necessary between electrical devices or components located throughout the thermal slug 210. The conductive traces 214 and ceramic feedthrough 220 form a connector interface on the side of the base that is outside TO-can 206.

The connector interface formed by the surface of ceramic feedthrough 220 and conductive traces 214 is used-to electrically connect the header assembly 204 to a second electrical subassembly, such as a printed circuit board, indirectly by an intermediary device including, for example, a flexible printed circuit. Alternatively, the connector interface could couple directly to a conventional printed circuit board by using, for example, a z-axis adhesive.

Typically, one of the conductive traces is a ground trace that may be electrically connected directly to base 212. Additionally, various types of devices are mounted on one side of the base of the header and connected to the traces. In this exemplary embodiment, such devices include, inter alia, a laser disposed on top of a TEC 218, which, in turn, is mounted to the ceramic feedthrough 220. Thus, power and control of the device is supplied to the laser and the TEC 218 by way of connectors on ceramic feedthrough 220, including one or more high speed data high speed data pads, one or more low speed data pads, and one or more high current pads.

In connection with the foregoing, it should be noted further that ceramics and metals are exemplary materials only and any other material or combination thereof that will facilitate implementation of the functionality disclosed herein may alternatively be employed. Moreover, other embodiments of the invention may employ different arrangements and numbers of, for example, conductive and non-conductive feedthroughs, or feedthroughs having other desirable characteristics. Accordingly, the illustrated embodiments are exemplary only and should not be construed to limit the scope of the invention in any way.

Regarding the operational aspects of TOSA 102, in general, power is provided to EML 216, photodiode 217, TEC 218, and/or other electrical components by way of conductive traces 214 at connector interface of ceramic feedthrough 220. In response, EML 216 emits an-optical signal. Heat generated as a result of the operation of EML 216 and/or other electronic components is continuously removed by TEC 218 to keep the operating temperature within a set variance such the laser emits at the desired wavelength. The thermal slug 210 passes through base 212 and thereby ultimately transmits heat out of TOSA 102.

Figure 3:
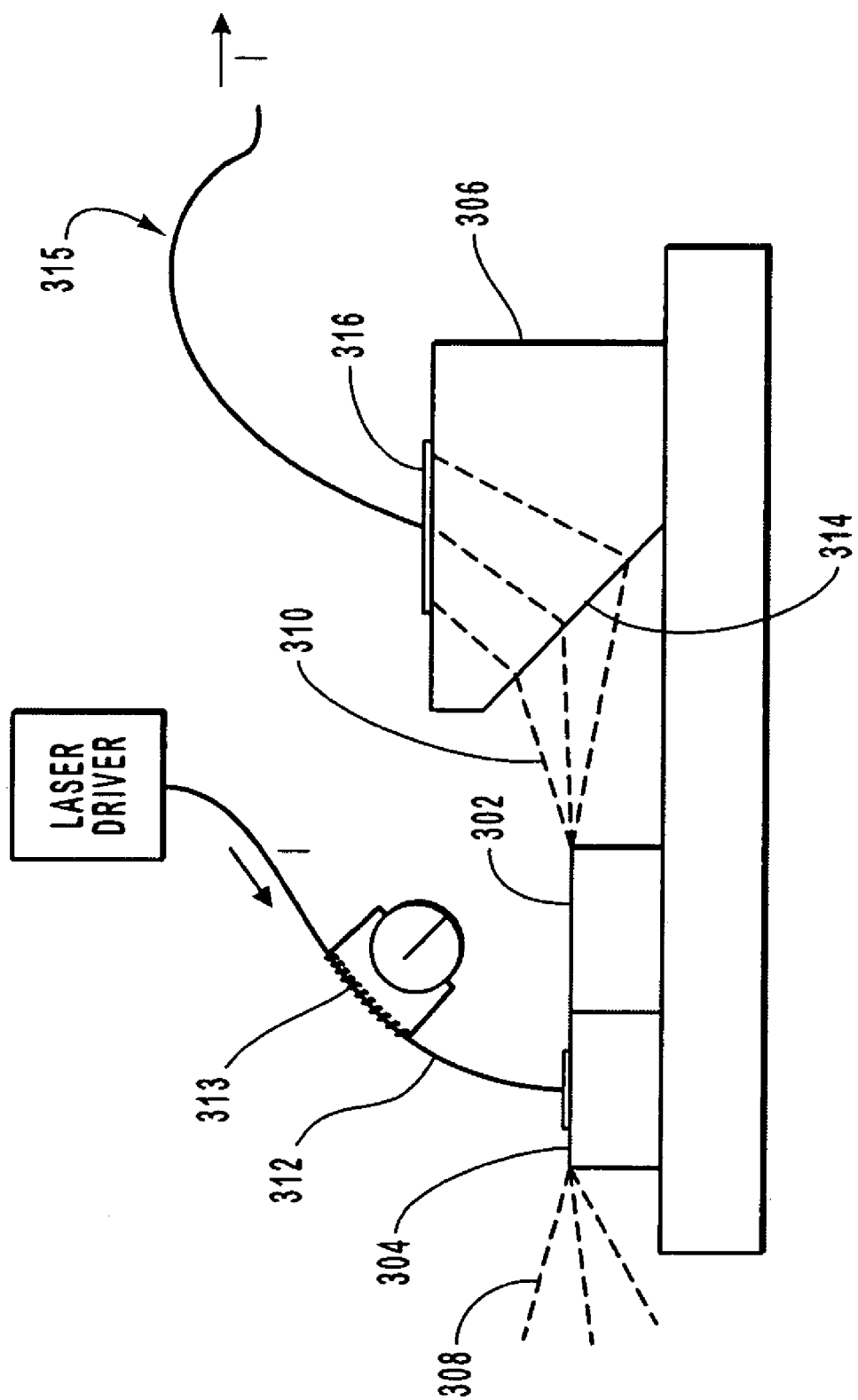
FIG. 3 is a schematic diagram that illustrates aspects of an externally modulated laser with an accompanying photodiode assembly according to embodiments of the invention.

Referring now to FIG. 3, a general illustration of a laser diode 302 in relation to a modulator 304 and a photodiode 306 is presented. The laser diode 302 and modulator 304 collectively are integrated as parts of an EML. Generally, those skilled in the art will recognize, in view of the disclosure herein, that various of known laser devices may be compatible with embodiments of the invention. Preferred, however, is a distributed feedback (DFB) laser.

Generally, a DFB laser produces a stream of coherent, monochromatic light by stimulating photon emission from a solid state material. DFB lasers are commonly used in optical transmitters, which are responsible for modulating electrical signals into optical signals for transmission via an optical communication network. A DFB laser includes a positively or negatively doped bottom layer or substrate, and a top layer that is oppositely doped with respect to the bottom layer. An active region, bounded by confinement regions, is included at the junction of the two layers. These structures together form the laser body.

In addition, a DFB laser includes a grating in either the top or bottom layer to assist in producing a coherent photon beam. For example, the grating is typically produced in the top layer of the laser diode 302 body by depositing a first p-doped top layer, for example, having a first index of refraction atop the active region, then etching evenly spaced grooves into the first top layer to form a tooth and gap cross sectional grating structure along the length of the grating. A second p-doped top layer having a second index of refraction is deposited atop the first top layer such that it covers and fills in the grating structure. During operation of the laser diode 302, the tooth and gap structure of the grating, which is overlapped by optical field patterns created in the active region, provides reflective surfaces that couple both forward and backward propagating coherent light waves that are produced in the active region of the laser. Thus, the grating provides feedback, thereby allowing the active region to support coherent light wave oscillation. This feedback occurs along the length of the grating, hence the name of distributed feedback laser. After reflection is complete, the amplified light waves are then output via the front and rear facets as a coherent light signal. DFB lasers are typically known as single mode devices as they produce light signals at one of several distinct wavelengths, such as 1,310 nm or 1,550 nm. Such light signals are appropriate for use in transmitting information over great distances via an optical communications network.

In operation, a coherent stream of light that is produced in the active region of the laser diode 302 can be emitted through either longitudinal end, or facet, of the laser body, as depicted by emitted light 308 from the front facet of the laser diode 302 and emitted light 310 from the rear facet of the laser diode 302. Although the rear facet is typically coated with a high reflective material that redirects photons produced in the active region toward the front facet in order to maximize the emission of coherent light from the front facet, sufficient emission of coherent light from the rear facet is allowed to pass through the rear facet to impact photodiode 306.

Modulator 304 is used to modulate digital data onto the light received from the laser diode 302, converting it from an un-modulated optical signal to a modulated optical signal, which is suitable for transmitting data via an optical communications network. Generally speaking, the modulator 304 can be selectively cycled between a powered state and an un-powered state in rapid succession so as to selectively enable the optical signal to either pass through the modulator or be absorbed thereby. This selective transmission of the optical signal through the modulator 304 creates a series of light pulses representing either a digital "one" or a digital "zero," depending on the configuration of the signal, which corresponds to the data carried by electrical data signal. This in turn transforms the un-modulated optical signal, previously including a continuous stream of light waves, into a modulated, data-carrying optical signal, including a series of light pulses and light voids, which is now suitable for transmission via an optical communications network. Power is supplied to the modulator 304 to effect the signal modulation, for example by conductive wire bond 312. In one embodiment of the invention, a sensing resistor 313 is placed on wire bond 312 to determine the current applied to the modulator 304. As noted elsewhere herein, this determined current is proportional to the wavelength of the emitted light.

The modulator is preferably an electroabsorption modulator that absorbs light depending on a control voltage. An electroabsorption modulator is a frequency response modulator, meaning that the frequency of the laser light passing through the modulator affects the current draw through the modulator. Accordingly, other modulators that rely upon an applied voltage and a frequency response current draw are also compatible with the invention. An externally modulated laser having an electroabsorption modulator can be referred to as an EA EML (electroabsorption externally modulated laser).

In light of the above disclosure, it is appreciated that the modulator 304 can have other configurations with substantially thee same functionality as will be described while still residing within the scope of the present invention. Moreover, one skilled in the art will also appreciate that the modulator 304 can include different or additional components while still performing the functionality as discussed herein. Thus, these and other modifications to the present teachings are contemplated as being part of the invention.

Monitoring the temperature of the laser and modulator is accomplished using a thermistor located in proximity of the devices. Moreover, one skilled in the art will also appreciate that the thermistor 230 can be replaced form one or more equivalent components while still performing the functionality as discussed herein.

Monitoring the output power of the laser diode 302 is accomplished using photodiode 306. Generally, it is desirable to locate the photodiode 306 in close proximity to the laser diode 302 so that a high percentage of the laser light emitted from the back facet of the laser diode 302 can be received by photodiode 306. This is not necessary, however, and the photodiode 306 may be located apart from the laser diode if light relaying devices, such as mirrors and optical fibers, are used to relay the light.

The photodiode 306 is used to detect the signal strength of the semiconductor laser 60 and relay this information back to control circuitry of the transmitter device. Although it is not required for all embodiments of the invention, in the depicted embodiment the photodiode is illustrated as mounted directly onto the same platform as the laser. The photodiode 306 is positioned with respect to the laser diode 302 so as to be able to receive a portion of the optical signal emitted by the laser diode 302. In particular, the photodiode 306 is positioned behind the laser diode 302 so as to be able to receive the back facet emission of laser diode 302. As shown in FIG. 3, both the light emitted from the front and back facets of the photodiode (diverging light 308, 310) are emitted from the laser diode 302 along a slightly diverging light path. Accordingly, the photodiode 306 is placed sufficiently close to the back facet of the laser diode 302 as to have a sufficient amount of light be incident upon the photodiode 306. Thus, while the front facet emission of the optical signal is ultimately transmitted through the various structures within a transmitter to propagate the optical signal into an optical fiber (see FIG. 2, for example), the back facet emission is predominantly absorbed by the photodiode 306.

In addition, the photodiode 306 in the illustrated embodiment includes an angled surface 314 and is positioned such that the light 310 emitted from the back facet of the laser diode 302 is incident upon the angled surface 314. The light 310 is then refracted by the angled surface 314 and is directed to an active area 316 of the photodiode 306. As a result, the power of the light emitted by the laser diode 302 can be determined by active area 216 and a signal indicating the power level can be relayed by a wire bond 315, for example, to components that are used to determine the wavelength of the light. This enables laser performance to be continuously monitored and altered, if needed, in order to optimize laser performance. It will be understood by those skilled in the art, in view of the disclosure herein, that this photodiode configuration is merely one of various photodiode designs that can be implemented according to the invention.

Figure 4:
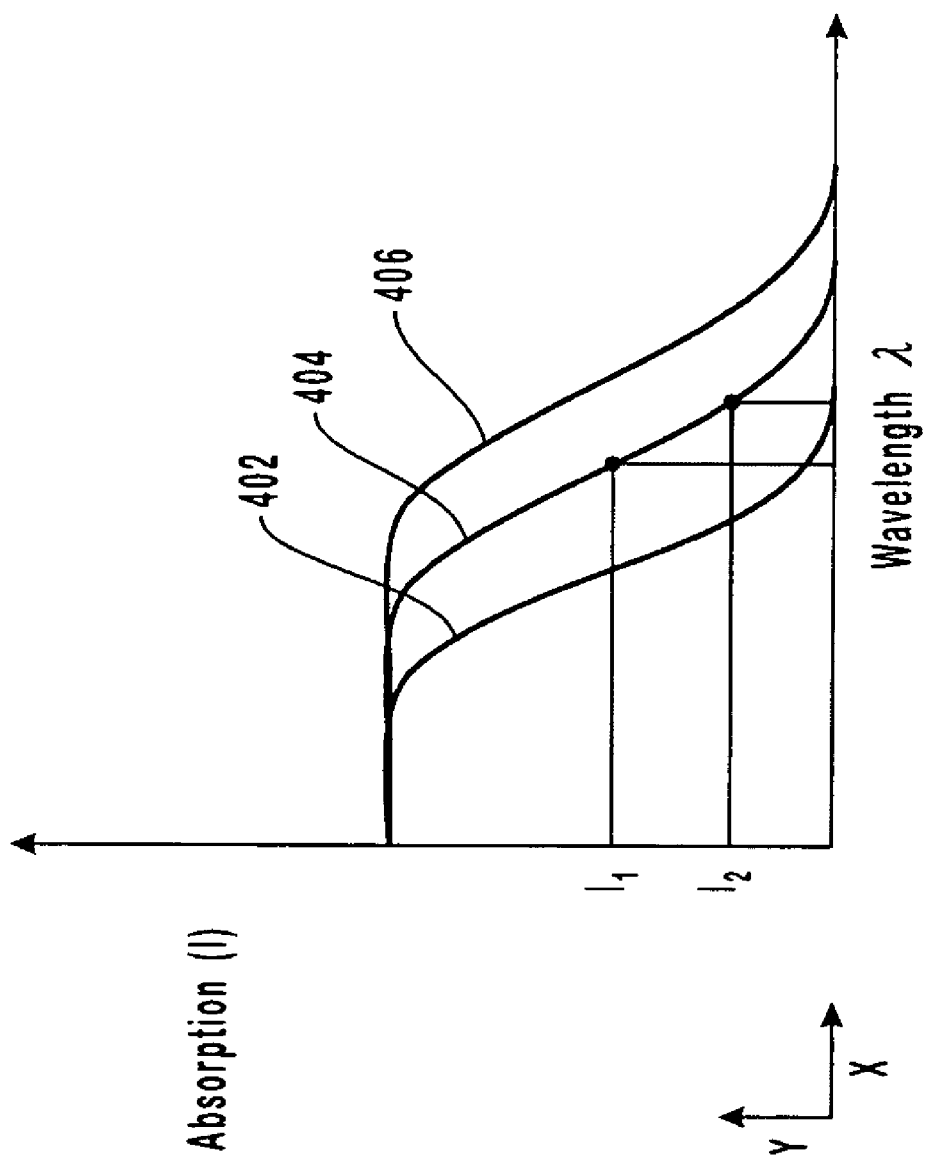
FIG. 4 is a representative graph that generally depicts the relationship between modulator absorption and wavelength for use in determining wavelength according to embodiments of the invention.

Reference is now made to FIG. 4, which shows a representative chart depicting the modulator absorption versus wavelength spectra for an EA EML, when an energizing voltage is applied to the modulator as described herein. Three curves 402, 404, 406 are depicted, illustrating three absorption versus wavelength curves that correspond to three different voltages applied across the modulator at a given temperature. In fact, the number of such curves is as numerable as the number of discreet voltages that can be applied. In the following discussion, however, only curve 404 will be referenced. For reference, the y axis depicted in FIG. 4 represents the amount of optical signal absorption by the modulator in the absorptive state and the x axis represents the wavelength of the emitted light.

Generally, in the operation of an electroabsorption modulator DC voltage is applied to the modulator in one of two voltages. One voltage energizes the modulator to increase absorption, and therefore reduce transmission, of light at the laser emitted wavelength. The other voltage, in turn, reduces absorption and increases transmission of the laser emitted wavelength. Because the electroabsorption modulator is a frequency response device, the resistance of the modulator varies with the wavelength. Thus, as seen in FIG. 4, when the laser is operating as desired and is emitting at wavelength 1 ($\lambda_1$), a particular current ($I_1$) is drawn. As the wavelength of the laser shifts, however, as seen at wavelength 2 ($\lambda_2$), a different current ($I_2$) is drawn. This is because, in view of Ohm's law of V=IR, as the resistance of the modulator varies with the wavelength of the light, the constant voltage dictates a varying current that is controlled by the wavelength shift.

This relationship, however, presupposes a constant output power of the laser and a constant temperature. This is not always the case since laser output power may vary with a number of factors, including laser age. Hence, the present invention monitors the output power of the laser with a photodiode and the temperature with a thermistor. The wavelength can thus be determined as a ratio of a change in current to the modulator over the current detected at the photodiode while at a known and constant temperature.

Once the wavelength of the light emitted by the laser diode is known or a wavelength shift detected, it can be readily determined whether the transmitter's operating parameters need to be altered in order to return the emitted wavelength to within an acceptable tolerance range. If it is determined that the wavelength of the laser diode needs to be modified, such modification can occur in a variety of ways. For example, a thermoelectric cooler ("TEC"), such as TEC 218, can be employed to either remove heat from or introduce heat to the laser diode, thereby modifying the emitted wavelength. In one embodiment, the laser diode will be mounted on a laser mount which in turn is mounted upon a TEC. Depending on the actual wavelength emitted by the laser diode 304, a controller will cause the TEC to alter the temperature of the laser diode 304, thereby heating or cooling the laser mount and altering the transmission wavelength of the laser diode 304. The controller makes a decision based on the detected wavelength. Further details regarding a compatible TEC structure and operation can be found in U.S. application Ser. No. 10/231,395 entitled "Header Assembly Having Integrated Cooling Device," filed Aug. 29, 2002, which is incorporated herein by reference in its entirety.

Figure 5:
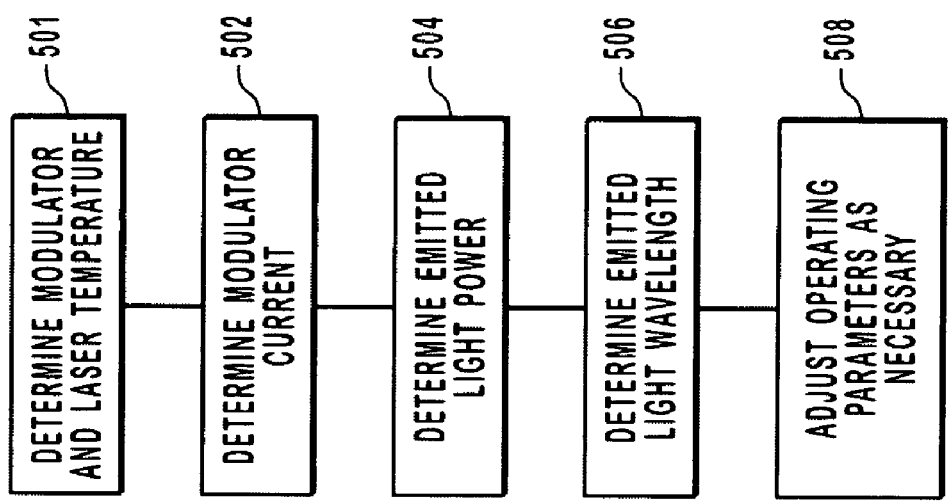
FIG. 5 is a flow chart depicting in block form a method of implementing one embodiment of the invention.

One example embodiment of methods according to the invention is depicted in FIG. 5 as a series of acts. Accordingly, a first act includes determining the modulator and laser temperature through a thermistor as indicated by act 501. The current applied to a modulator that receives and is modulating a beam of light from a laser diode is also determined, as indicated by act 502. Next, as indicated by act 504, the optical power of the beam of light received from the back facet of the laser diode is determined. The order of these acts is not important and may in fact be reversed or simultaneous. Next, using the determined temperature and current applied to the modulator and the determined optical power of the beam of light, the wavelength of the beam of light is determined, as indicated by act 506. Each of the foregoing acts is performed in accordance with the devices and methods disclosed herein.

In the event that a wavelength shift that needs correcting is identified, the operating parameters of the laser can be adjusted to return the wavelength of the emitted light to within design parameters, as indicated by act 508. For example, one embodiment of the invention includes: upon determining that the wavelength of the light has shifted from an intended wavelength, modifying the cooling or heating activity of a thermoelectric cooler.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can be RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. In one embodiment of the invention, the computer readable medium will be integrated into a printed circuit board within an optical transceiver.

Although not required, the invention may be described and claimed in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of determining the wavelength of light emitted by a laser diode, the method comprising:
   determining the temperature of a laser diode or a modulator that receives a beam of light from the laser diode and modulates an optical signal onto the beam of light;
   determining the current applied to the modulator;
   determining the optical power of the beam of light emitted from the laser diode; and
   determining the wavelength of the beam of light using the determined temperature, determined current applied to the modulator, and the determined optical power of the beam of light.

2. A method as in claim 1, wherein the modulator has a variable frequency response such that the current consumed by the modulator varies with the wavelength of the beam of light the modulator is modulating.

3. A method as in claim 1, wherein the act of determining the wavelength of the beam of light comprises identifying a shift in the wavelength from the ratio of the current applied to the modulator to the current of the emitted beam of light, as measured at a photodiode at a known temperature.

4. A method as in claim 1, wherein the laser diode comprises a distributed feedback laser.

5. A method as in claim 1, wherein the modulator comprises an electroabsorption modulator.

6. A method as in claim 1, wherein the act of determining the optical power of the beam of light comprises receiving a portion of the light emitted by the laser diode at a photodiode.

7. A method as in claim 1, wherein the portion of the light emitted by the laser diode is emitted from a back facet of the laser diode.

8. A method of maintaining the wavelength of light emitted by a laser diode within a selected tolerance range, comprising:
   performing the method of claim 1; and
   upon determining that the wavelength of the light has shifted from an intended wavelength, modifying the cooling or heating activity of a thermoelectric cooler which is located in the vicinity of the laser diode, wherein the wavelength of the light emitted by the laser diode varies with the operating temperature of the laser diode and therefore varies with a change in temperature effectuated by the thermoelectric cooler.

9. A method of determining the wavelength of light emitted by a laser diode, the method comprising:
   determining the temperature of an electroabsorption modulator that receives a beam of light from a front facet of a distributed feedback laser through a thermistor in close proximity with the electroabsorption modulator;
   determining the current applied to the electroabsorption modulator, wherein the electroabsorption modulator and the distributed feedback laser comprise an integrated device;
   at a photodiode, determining the optical power of the beam of light received from a back facet of the distributed feedback laser; and
   determining the wavelength of the beam of light from the known temperature and the ratio of the current applied to the electroabsorption modulator to the optical power of the beam of light.

10. A method as in claim 9, wherein the electroabsorption modulator has a variable frequency response such that the current consumed by the modulator varies with the wavelength of the beam of light the modulator is modulating.

11. A method of maintaining the wavelength of light emitted by a laser diode within a selected tolerance range, comprising:
   performing the method of claim 9; and
   upon determining that the wavelength of the beam of light has shifted from an intended wavelength, modifying the cooling or heating activity of a thermoelectric cooler which is located in the vicinity of the distributed feedback laser, wherein the wavelength of the light emitted by the distributed feedback laser varies with the operating temperature of the distributed feedback laser and therefore varies with a change in temperature effectuated by the thermoelectric cooler.

12. An optical transceiver comprising:
   a laser diode that emits a beam of light;
   a modulator that receives the beam of light from the laser diode and modulates an optical signal onto the beam of light;
   a laser driver that applies a voltage to the modulator;
   a sensing resistor that determines the current traveling to the modulator, wherein the wavelength of light emitted by the laser diode is determined by:

determining the temperature of the laser diode or modulator determining the current applied to the modulator determining the optical power of the beam of light emitted from the laser diode; and determining the wavelength of the beam of light using the determined temperature, determined current applied to the modulator, and the determined optical power of the beam of light.

13. An optical transceiver as in claim 12, wherein the modulator has a variable frequency response such that the current consumed by the modulator varies with the wavelength of the beam of light the modulator is modulating.

14. An optical transceiver as in claim 12, wherein the laser diode comprises a distributed feedback laser.

15. An optical transceiver as in claim 12, wherein the modulator comprises an electroabsorption modulator.

16. An optical transceiver as in claim 12, further comprising a photodiode that receives a portion of the light emitted by the laser diode to determine the optical power of the beam of light emitted from the laser diode.

17. An optical transceiver as in claim 16, wherein the portion of the light emitted by the laser diode is emitted from a back facet of the laser diode.

18. An optical transceiver as in claim 12, further comprising a thermoelectric cooler located in the vicinity of the laser diode, the cooling or heating activity of the thermoelectric cooler being modified to vary the wavelength of the light emitted by the laser diode to maintain an intended wavelength upon determining that the wavelength of the light has shifted from the intended wavelength.

* * * * *

UNITED STATES PATENT AND TRADEMARK OFFICE
CERTIFICATE OF CORRECTION

PATENT NO. : 7,372,879 B2 Page 1 of 1
APPLICATION NO. : 11/006032
DATED : May 13, 2008
INVENTOR(S) : Giaretta et al.

It is certified that error appears in the above-identified patent and that said Letters Patent is hereby corrected as shown below:

Column 1
Line 9, change "60,527,220" to --60/527,220--

Column 2
Line 25, change "a" to --as--

Column 5
Line 42, change "laser" to --Laser--

Column 7
Line 29, change "such" to --such that--

Column 8
Line 61, change "thee" to --the--

Column 9
Line 4, change "form" to --to form--
Line 17, delete "60"
Line 45, change "216" to --316--

Signed and Sealed this

Nineteenth Day of October, 2010

David J. Kappos
*Director of the United States Patent and Trademark Office*